(12) United States Patent
Chen et al.

(10) Patent No.: US 7,633,575 B2
(45) Date of Patent: Dec. 15, 2009

(54) LIQUID CRYSTAL DISPLAY DEVICE WITH PIXEL ELECTRODE VOLTAGE DIFFERENTIAL

(75) Inventors: Chien-Cheng Chen, Miao-Li (TW);
Yu-Cheng Lin, Miao-Li (TW);
Hung-Yu Chen, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 12 days.

(21) Appl. No.: 12/157,066

(22) Filed: Jun. 6, 2008

(65) Prior Publication Data

US 2008/0303969 A1   Dec. 11, 2008

(30) Foreign Application Priority Data

Jun. 8, 2007   (CN) .................. 2007 1 0074778

(51) Int. Cl.
*G02F 1/136* (2006.01)
(52) U.S. Cl. .............. 349/46; 349/43; 349/44; 349/45; 349/47; 349/48
(58) Field of Classification Search ............. 349/43–48
See application file for complete search history.

(56) References Cited

U.S. PATENT DOCUMENTS

| | | | | |
|---|---|---|---|---|
| 5,608,556 A | * | 3/1997 | Koma | 349/143 |
| 6,067,141 A | * | 5/2000 | Yamada et al. | 349/129 |
| 6,342,938 B1 | * | 1/2002 | Song et al. | 349/143 |
| 6,369,870 B1 | * | 4/2002 | Koma | 349/130 |
| 6,630,975 B1 | * | 10/2003 | Terashita | 349/139 |
| 6,930,739 B2 | * | 8/2005 | Takeda et al. | 349/129 |
| 7,016,001 B2 | | 3/2006 | Tanaka et al. | |
| 7,079,210 B2 | * | 7/2006 | Um et al. | 349/122 |
| 7,098,978 B2 | * | 8/2006 | Chen et al. | 349/129 |
| 7,139,055 B2 | * | 11/2006 | Ogishima et al. | 349/129 |
| 7,215,395 B2 | * | 5/2007 | Kubo et al. | 349/129 |
| 2001/0020992 A1 | * | 9/2001 | Takeda et al. | 349/130 |
| 2006/0066795 A1 | * | 3/2006 | Hsu et al. | 349/136 |
| 2008/0303969 A1 | * | 12/2008 | Chen et al. | 349/46 |

\* cited by examiner

*Primary Examiner*—Frank G Font
*Assistant Examiner*—Jerry Blevins
(74) *Attorney, Agent, or Firm*—Wei Te Chung

(57) ABSTRACT

An exemplary liquid crystal display (100) includes gate lines (122), and data lines (123) cooperatively defining pixel units. Each pixel unit includes a first thin film transistor (TFT) (125), a second TFT (126), a first pixel electrode (127), and a second pixel electrode (128). Gate electrodes of the two TFTs are connected to one of the gate lines. A source electrode of the first TFT is connected to one of the data lines. A drain electrode of the first TFT is connected to the first pixel electrode. A source electrode of the second TFT is connected to the first pixel electrode. A drain electrode of the second TFT is connected to the second pixel electrode. A channel width/length ratio of the second TFT is such that a voltage of the drain electrode thereof is less than a voltage of the source electrode thereof when the second TFT is switched on.

20 Claims, 7 Drawing Sheets

LIQUID CRYSTAL DISPLAY DEVICE WITH PIXEL ELECTRODE VOLTAGE DIFFERENTIAL

FIELD OF THE INVENTION

The present invention relates to liquid crystal display (LCD) devices, and particularly to a multi-domain vertical alignment (MVA) LCD device configured to efficiently achieve multi-domain alignment of liquid crystal molecules.

BACKGROUND OF THE INVENTION

A typical LCD device has the advantages of portability, low power consumption, and low radiation, and has been widely used in various portable information products such as notebooks, personal digital assistants (PDAs), video cameras and the like. A conventional LCD device such as a twisted nematic (TN) LCD device commonly has a rather limited viewing angle. Thus, the MVA-type LCD device was developed to improve the viewing angle.

Referring to FIG. 11 and FIG. 12, aspects of a typical MVA-type LCD device 500 are shown. The LCD device 500 includes a first substrate assembly 510, a second substrate assembly 520 generally facing the first substrate assembly 510, and a liquid crystal layer 530 sandwiched between the two substrate assemblies 510, 520. The liquid crystal layer 530 includes a plurality of liquid crystal molecules 531.

The first substrate assembly 510 includes a first transparent substrate 511, a color filter 513, a common electrode 515, and a plurality of first protrusions 519, arranged in that order from top to bottom. The color filter 513 includes a plurality of red filter units (not shown), a plurality of green filter units (not shown), and a plurality of blue filter units (not shown). The first protrusions 519 each have a triangular section configuration, and are arranged along a plurality of V-shaped paths.

The second substrate assembly 520 includes a second transparent substrate 521, a plurality of gate lines 522 that are parallel to each other and that each extend parallel to a first direction, a plurality of first data lines 523 that are parallel to each other and that each extend parallel to a second direction that is orthogonal to the first direction, a plurality of second data lines 524 that are parallel to each other and that each extend parallel to the second direction, a plurality of first thin film transistors (TFTs) 525, a plurality of second TFTs 526, a plurality of first pixel electrodes 527, a plurality of second pixel electrodes 528, and a plurality of second protrusions 529.

The first data lines 523 and the second data lines 524 are arranged alternately. Every two adjacent first data lines 523 together with every two adjacent gate lines 522 form a rectangular area, which is defined as a pixel unit 50. Each pixel unit 50 corresponds to a filter unit of the color filter 513. Each second data line 524 is disposed across a middle of a corresponding pixel unit 50, and divides the pixel unit 50 into a first sub-pixel unit 501 and a second sub-pixel unit 502.

The first TFTs 525 are located in the vicinity of intersections of the first data lines 523 and the gate lines 522, respectively. The second TFTs 526 are located in the vicinity of intersections of the second data lines 524 and the gate lines 522, respectively. The first pixel electrodes 527 are located in the first sub-pixel units 501, and are connected to the first TFTs 525, respectively. The second pixel electrodes 528 are disposed in the second sub-pixel units 502, and are connected to the second TFTs 526, respectively. The first data lines 523 are used to apply first data voltages to the first pixel electrodes 527 through the respective first TFTs 525. The second data lines 524 are used to apply second data voltages to the second pixel electrodes 528 through the respective second TFTs 526. The second protrusions 529 of the second substrate assembly 520 are arranged alternately with the first protrusions 519 of the first substrate assembly 510.

Referring also to FIG. 13, this is a top-down view of orientations of four of the liquid crystal molecules 531, according to the protrusions 519, 529. When corresponding voltages are applied to the pixel electrodes 527, 528 and the common electrode 513, an electric field is generated therebetween. The liquid crystal molecules 531 twist according to the electric field. The liquid crystal molecules 531 are guided by the protrusions 519, 529 and thereby become aligned in four different directions. Thus four domains are defined according to the protrusions 519, 529.

Further, because the voltages of the first pixel electrodes 527 are different from the voltages of the second pixel electrodes 528 in each frame, tilt angles $\theta_1$ of the liquid crystal molecules 531 in the first sub-pixel units 501 are different from tilt angles $\theta_2$ of the liquid crystal molecules 531 in the second sub-pixel units 502. Thus, a total of eight domains are defined in each pixel unit 50. That is, the LCD device 500 achieves 8-domain vertical alignment.

However, each pixel unit 50 needs two data lines 523, 524 and two TFTs 525, 526 for the MVA-type LCD device 500 to be able to achieve 8-domain vertical alignment. The layout of the data lines 523, 524 is complicated, and the cost of the LCD device 500 is correspondingly high. Furthermore, an aperture ratio of the LCD 500 is reduced.

It is desired to provide an improved MVA-type LCD device which can overcome the above-described deficiencies.

SUMMARY

In one preferred embodiment, a liquid crystal display device includes a plurality of gate lines, and a plurality of data lines intersecting with the gate lines. Every two adjacent gate lines and every two adjacent data lines define a pixel unit. Each pixel unit includes a first thin film transistor, a second thin film transistor, a first pixel electrode, and a second pixel electrode. Gate electrodes of the first and the second thin film transistors are connected to a same one of the gate lines. A source electrode of the first thin film transistor is connected to a corresponding one of the data lines. A drain electrode of the first thin film transistor is connected to the first pixel electrode. A source electrode of the second thin film transistor is connected to the first pixel electrode. A drain electrode of the second thin film transistor is connected to the second pixel electrode. A channel width/length ratio of the second TFT is such that a voltage of the drain electrode thereof is less than a voltage of the source electrode thereof when the second TFT is switched on.

Other novel features and advantages will become more apparent from the following detailed description when taken in conjunction with the accompanying drawings. In the drawings, all the views are schematic.

DETAILED DESCRIPTION OF PREFERRED EMBODIMENTS

Reference will now be made to the drawings to describe preferred and exemplary embodiments of the present invention in detail.

Figure 1:
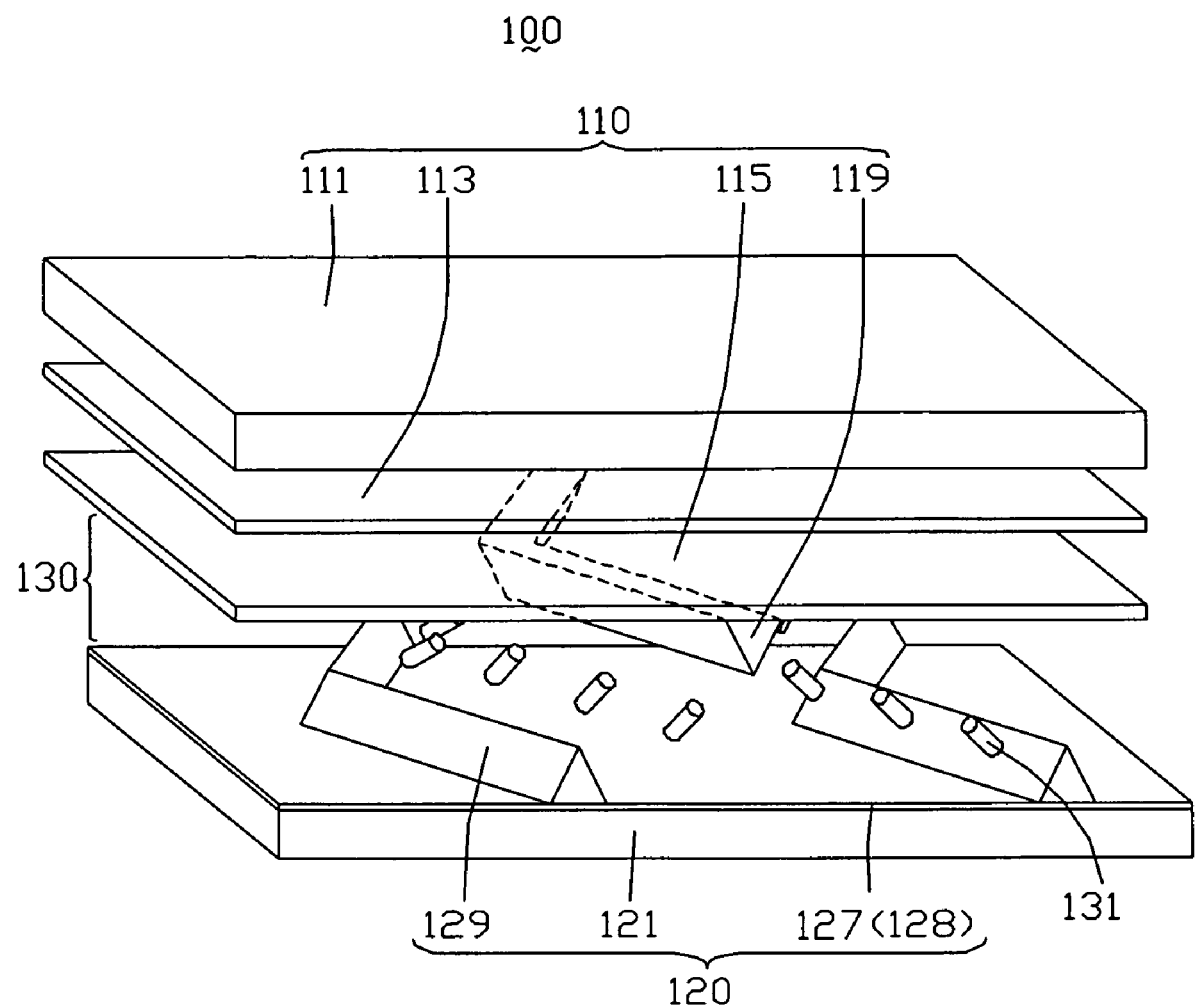
FIG. 1 is an exploded, isometric view of an LCD device according to a first embodiment of the present invention, the LCD device including a plurality of first protrusions, a plurality of second protrusions, and a plurality of pixel units.
Figure 2:
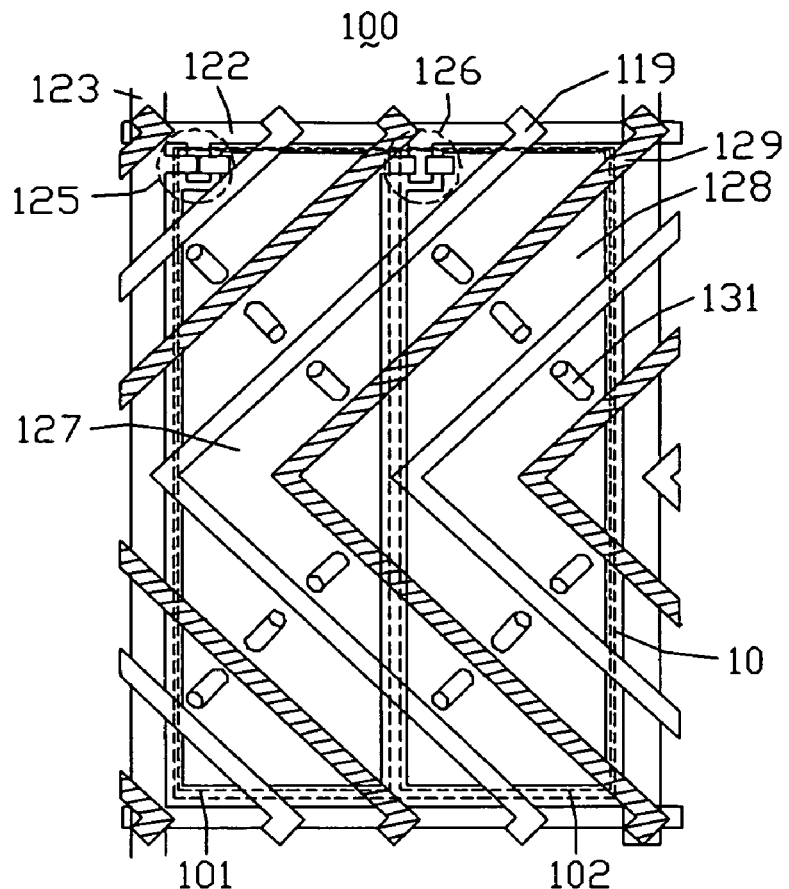
FIG. 2 is a top plan view of one pixel unit of the LCD device of FIG. 1, the pixel unit including a gate line, a data line, a first pixel electrode, a second pixel electrode, and a plurality of liquid crystal molecules.

Referring to FIG. 1 and FIG. 2, an MVA-type LCD device 100 according to a first embodiment of the present invention includes a first substrate assembly 110, a second substrate assembly 120 parallel to the first substrate assembly 110, and a liquid crystal layer 130 sandwiched between the two substrate assemblies 110, 120. The liquid crystal layer 130 includes a plurality of liquid crystal molecules 131.

The first substrate assembly 110 includes a first transparent substrate 111, a color filter 113, a common electrode 115, and a plurality of first protrusions 119, arranged in that order from top to bottom. The color filter 113 includes a plurality of red filter units (not shown), a plurality of green filter units (not shown), and a plurality of blue filter units (not shown). The first protrusions 119 each have a triangular section configuration, and are arranged along a plurality of V-shaped paths.

The second substrate assembly 120 includes a second transparent substrate 121, a plurality of gate lines 122 that are parallel to each other and that each extend parallel to a first direction, a plurality of data lines 123 that are parallel to each other and that each extend parallel to a second direction that is orthogonal to the first direction, a plurality of first thin film transistors (TFTs) 125, a plurality of second TFTs 126, a plurality of first pixel electrodes 127, a plurality of second pixel electrodes 128, and a plurality of second protrusions 129.

Every two adjacent gate lines 122 together with every two adjacent data lines 123 form a rectangular area defined as a pixel unit 10. Each pixel unit corresponds to a filter unit, and is divided into a first sub-pixel unit 101 and a second sub-pixel unit 102. The first pixel electrodes 127 are disposed in the first sub-pixel units 101. The second pixel electrodes 128 are disposed in the second sub-pixel units 102.

The first TFTs 125 are located in the vicinity of intersections of the gate lines 122 and the data lines 123, respectively. Each first TFT 125 includes a source electrode (not labeled) connected to the corresponding data line 123, a gate electrode (not labeled) connected to the corresponding gate line 122, and a drain electrode (not labeled) connected to the corresponding first pixel electrode 127. Each second TFT 126 is located between the first pixel electrode 127 and the corresponding second pixel electrode 128. Each second TFT 126 includes a gate electrode (not labeled) connected to the same gate line 122 that the corresponding first TFT 125 is connected to, a source electrode (not labeled) connected to the first pixel electrode 127, and a drain electrode (not labeled) connected to the second pixel electrode 128. Channel width/length (W/L) ratios of the first TFTs 125 and second TFTs 126 are different. In particular, the channel width/length $(W/L)_1$ ratio of each first TFT 125 is substantially greater than the channel width/length $(W/L)_2$ of each second TFT 126.

A relationship between a drain current $I_d$ and a channel width/length ratio of a TFT is provided by the following equation:

$$I_d = U_n C_{ox} \frac{W}{L} \left[ (V_{gs} - V_t) V_{ds} - \frac{V_{ds}^2}{2} \right] \quad (1)$$

wherein $U_n$ represents a field effect mobility of the TFT, $C_{ox}$ represents a gate oxide capacitance, $V_{gs}$ represents a voltage difference between a gate electrode and a drain electrode of the TFT, $V_t$ represents a threshold voltage of the TFT, $V_{ds}$ represents a voltage difference between a source electrode and the drain electrode of the TFT, and (W/L) represents a channel width/length ratio of the TFT. According to the above equation (1), the drain current $I_d$ of the TFT is proportional to the channel width/length ratio of the TFT when the other parameters are fixed. Furthermore, the greater the value of $I_d$, the stronger the charging capability of the TFT, and the quicker the voltage of the drain electrode reaches the value of the voltage of the corresponding source electrode.

The $(W/L)_1$ of the first TFT 125 is 15/5. Throughout a switched-on time of the first TFT 125, the voltage of the drain electrode is substantially equal to the voltage of the source electrode. The $(W/L)_2$ of the second TFT 126 is 5/10. During a switched-on time of the second TFT 126, the voltage of the drain electrode is less than the voltage of the source electrode.

Figure 3:
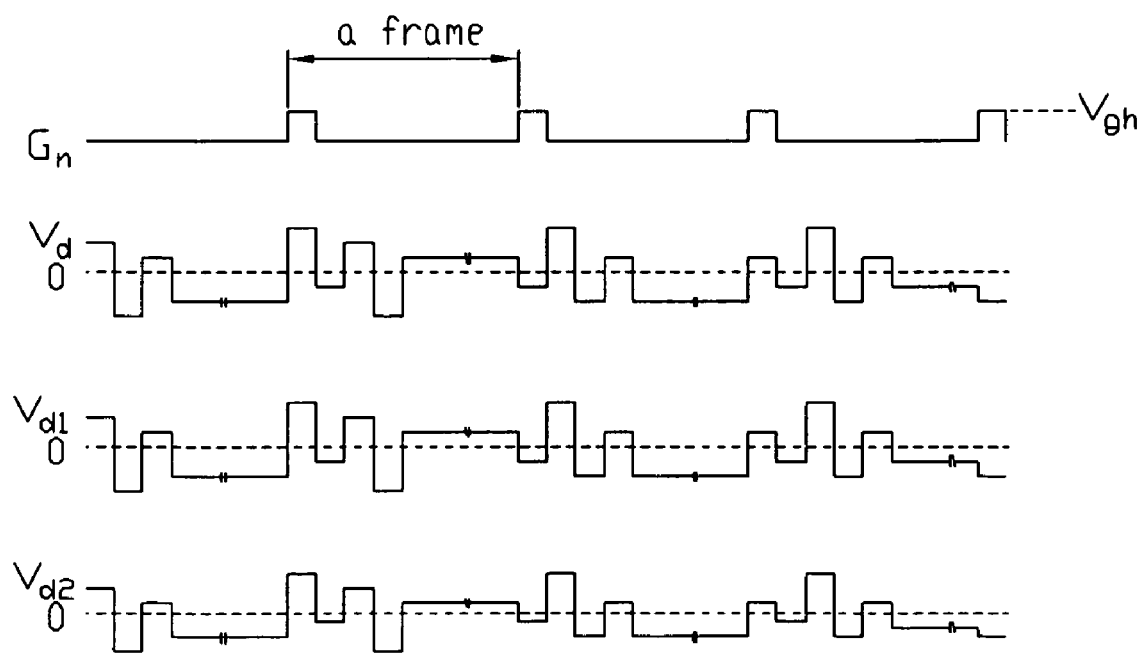
FIG. 3 is a graph showing abbreviated voltage waves of the gate line, the data line, the first pixel electrode, and the second pixel electrode of FIG. 2.

Referring to FIG. 3, $G_n$ represents gate signals applied to the gate lines 122, $V_{gh}$ represents a threshold voltage of each of the TFTs 125, 126, $V_d$ represents data voltages of the data lines 123, $V_{d1}$ represents voltages of the first pixel electrodes 127, and $V_{d2}$ represents voltages of the second pixel electrodes 128. When the threshold voltage is applied to the first and second TFTs 125, 126, the first and second TFTs 125, 126 are both switched on, and the data line 123 applies a data voltage to the source electrode of the first TFT 125. Immediately, the voltage of the corresponding drain electrode is equal to the voltage of the source electrode, thus the voltage of the first pixel electrode 127 is equal to the data voltage. The $(W/L)_2$ of the second TFT 126 is a reduced value, which causes a voltage drop. Therefore the voltage of the second pixel electrode 128 is less than the data voltage. That is, the voltage of the second pixel electrode 128 is less than the voltage of the first pixel electrode 127.

Figure 4:
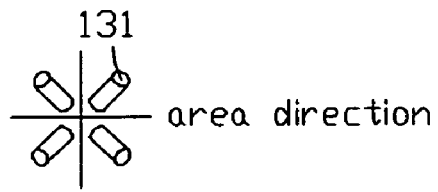
FIG. 4 is a top-down view of orientations of four of the liquid crystal molecules of FIG. 2, according to the corresponding first protrusions and second protrusions at the pixel unit.
Figure 5:
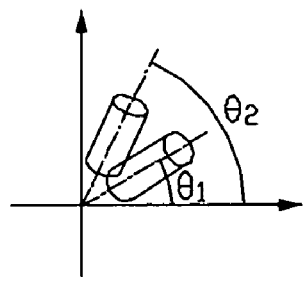
FIG. 5 is a schematic, side view of orientations of two of the liquid crystal molecules of FIG. 2, the liquid crystal molecules having different tilt angles.

Referring also to FIG. 4 and FIG. 5, these show a top-down view and a side view of orientations of certain of the liquid crystal molecules 131. When corresponding voltages are applied to the first pixel electrode 127, the second pixel electrode 128, and the common electrode 115, an electric field is generated. The liquid crystal molecules 131 twist according to the electric field. The liquid crystal molecules 131 are guided by the protrusions 119, 129 and thereby become aligned in four different directions. Thus four domains are defined according to the protrusions 119, 129. Because the voltages of the first pixel electrodes 127 are different from the voltages of the second pixel electrodes 128 in each frame, tilt angles $\theta_1$ of the liquid crystal molecules 131 in the first sub-pixel units 101 are different from tilt angles $\theta_2$ of the liquid crystal molecules 131 in the second sub-pixel units 102. Thus, a total of eight domains are defined in each pixel unit 10. That is, the LCD device 100 achieves 8-domain vertical alignment.

Unlike with conventional MVA-type LCD devices, the LCD device 100 includes the second TFTs 126. The second TFTs 126 also function as resistor assemblies to make the voltages of the first pixel electrodes 127 different from the voltages of the second pixel electrodes 128. Each pixel unit 10 needs only one data line 123 to achieve 8-domain vertical alignment. Thus, the layout of the LCD device 100 is simplified, and the cost of the LCD device 100 can be reduced. Furthermore, areas of the first and second pixel electrodes 127, 128 are increased, therefore an aperture ratio of the LCD device 100 is correspondingly increased.

Figure 6:
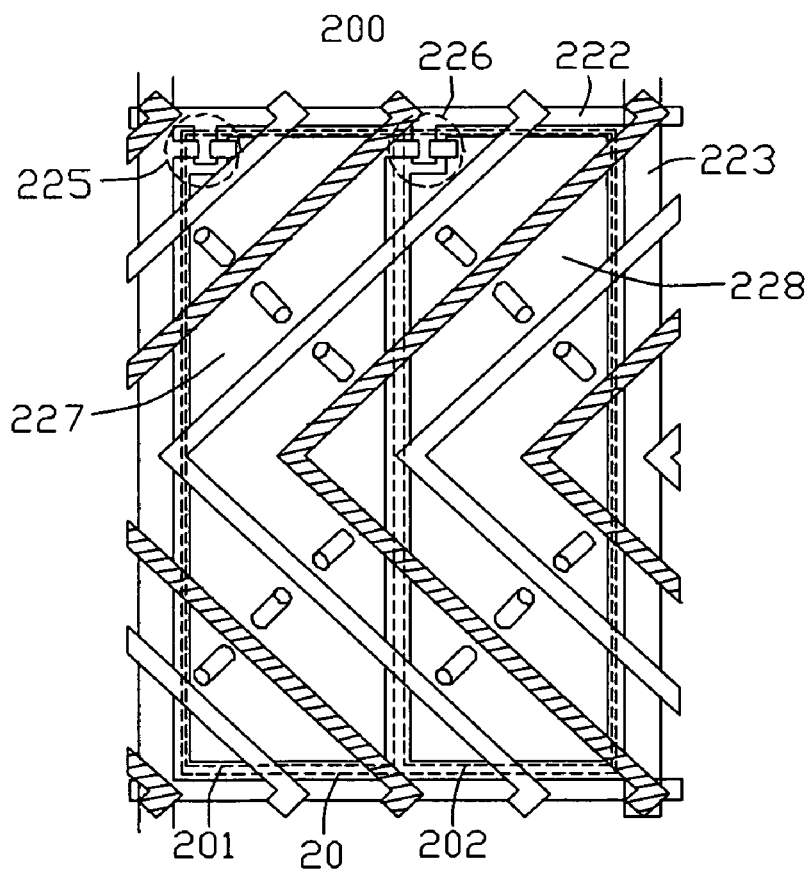
FIG. 6 is similar to FIG. 2, but showing a corresponding view in the case of one pixel unit of an LCD device according to a second embodiment of the present invention, the pixel unit including a gate line, a data line, a first pixel electrode, and a second pixel electrode.

Referring to FIG. 6, an LCD device 200 according to a second embodiment of the present invention is similar to the LCD device 100. However, a $(W/L)_1$ of each of first TFTs 225 and a $(W/L)_2$ of each of second TFTs 226 are both reduced. In particular, the $(W/L)_1$ and the $(W/L)_2$ are both 5/10. Similar to each of the second TFTs 226, when each of the first TFTs 225 is switched on, the voltage of the drain electrode is less than the voltage of the source electrode.

Figure 7:
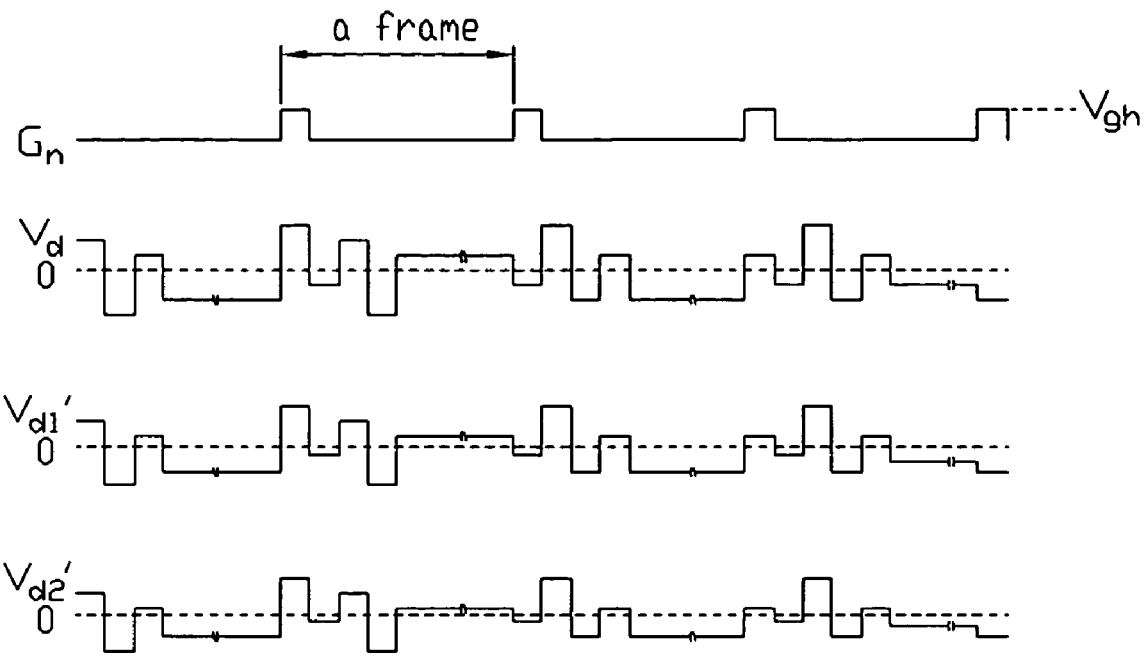
FIG. 7 is a graph showing abbreviated voltage waves of the gate line, the data line, the first pixel electrode, and the second pixel electrode of FIG. 6.

Referring also to FIG. 7, $G_n$ represents gate signals applied to the gate lines 222, $V_{gh}$ represents a threshold voltage of each of the TFTs 225, 226, $V_d$ represents data voltages of the data lines 223, $V_{d1}$ represents voltages of the first pixel electrodes 227, and $V_{d2}$ represents voltages of the second pixel electrodes 228. When the threshold voltage is applied to the first and second TFTs 225, 226, the first and second TFTs 225, 226 are both switched on. The $(W/L)_1$ of the first TFT 225 is a reduced value, which causes a voltage drop. Therefore the voltage of the first pixel electrode 227 is less than the data voltage. The $(W/L)_2$ of the second TFT 226 is also a reduced value, which causes a voltage drop. Therefore the voltage of the second pixel electrode 228 is less than the voltage of the first pixel electrode 227.

Four domains are defined according to the protrusions. Because the voltages of the first pixel electrodes 227 are different from the voltages of the second pixel electrodes 228 in each frame, tilt angles $\theta_1$ of the liquid crystal molecules in the first sub-pixel units 201 are different from tilt angles $\theta_2$ of the liquid crystal molecules in the second sub-pixel units 202. Thus, a total of eight domains are defined in each pixel unit 20. Thus the LCD device 200 can achieve advantages similar to those of the LCD device 100. Furthermore, because the first TFTs 225 and the second TFTs 226 are substantially identical, a process for manufacturing the TFTs 225, 226 of the LCD device 200 is relatively simple.

Figure 8:
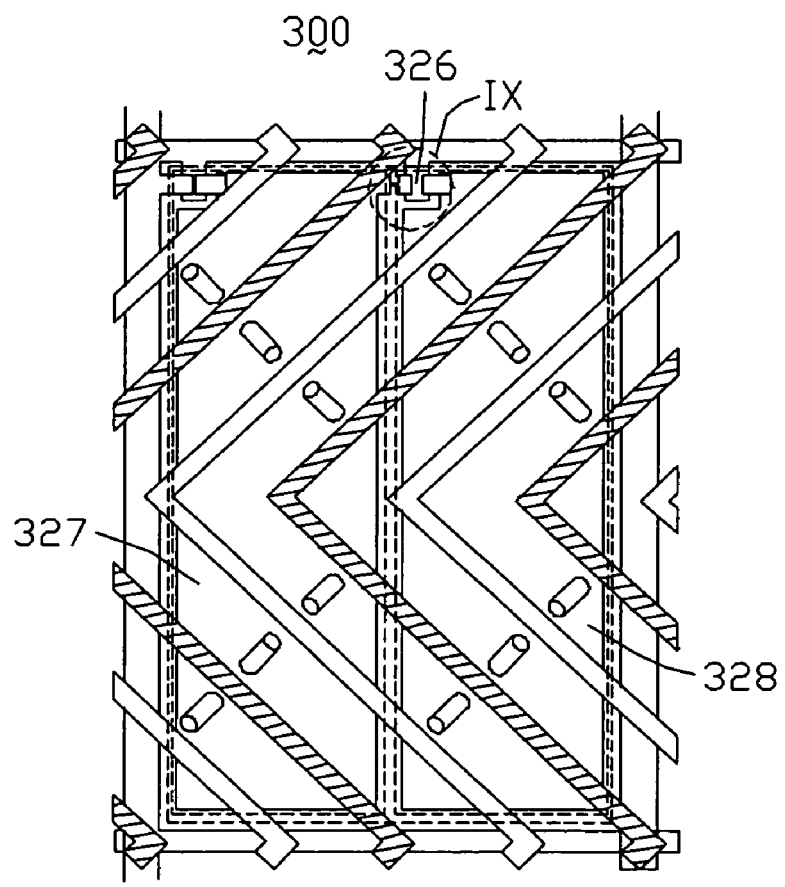
FIG. 8 is similar to FIGS. 2 and 6, but showing a corresponding view in the case of one pixel unit of an LCD device according to a third embodiment of the present invention.
Figure 9:
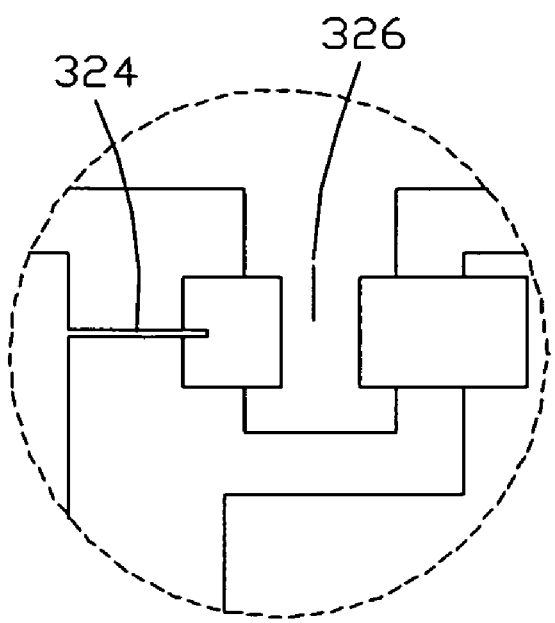
FIG. 9 is an enlarged view of a circled portion IX of FIG. 8.

Referring to FIG. 8 and FIG. 9, an LCD device 300 according to a third embodiment of the present invention is similar to the LCD device 100. However, in the LCD device 300, a part of each first pixel electrode 327 where the first pixel electrode 327 joins a source electrode (not labeled) of a corresponding second TFT 326 is long and thin (i.e. elongate). This part can be fabricated by etching, and forms a resistor 324. The resistor 324 and the second TFT 326 cooperatively form a resistor assembly. The resistor assembly leads to a greater voltage drop between the first pixel electrode 327 and the second pixel electrode 328. The LCD device 300 can achieve advantages similar to those of the LCD devices 100, 200.

Figure 10:
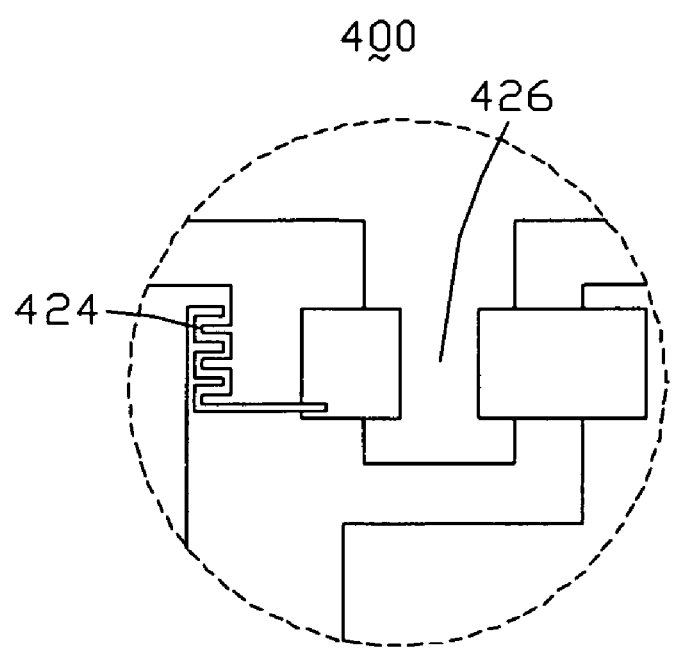
FIG. 10 is similar to FIG. 9, but showing a corresponding view in the case of one pixel unit of an LCD device according to a fourth embodiment of the present invention.
Figure 11:
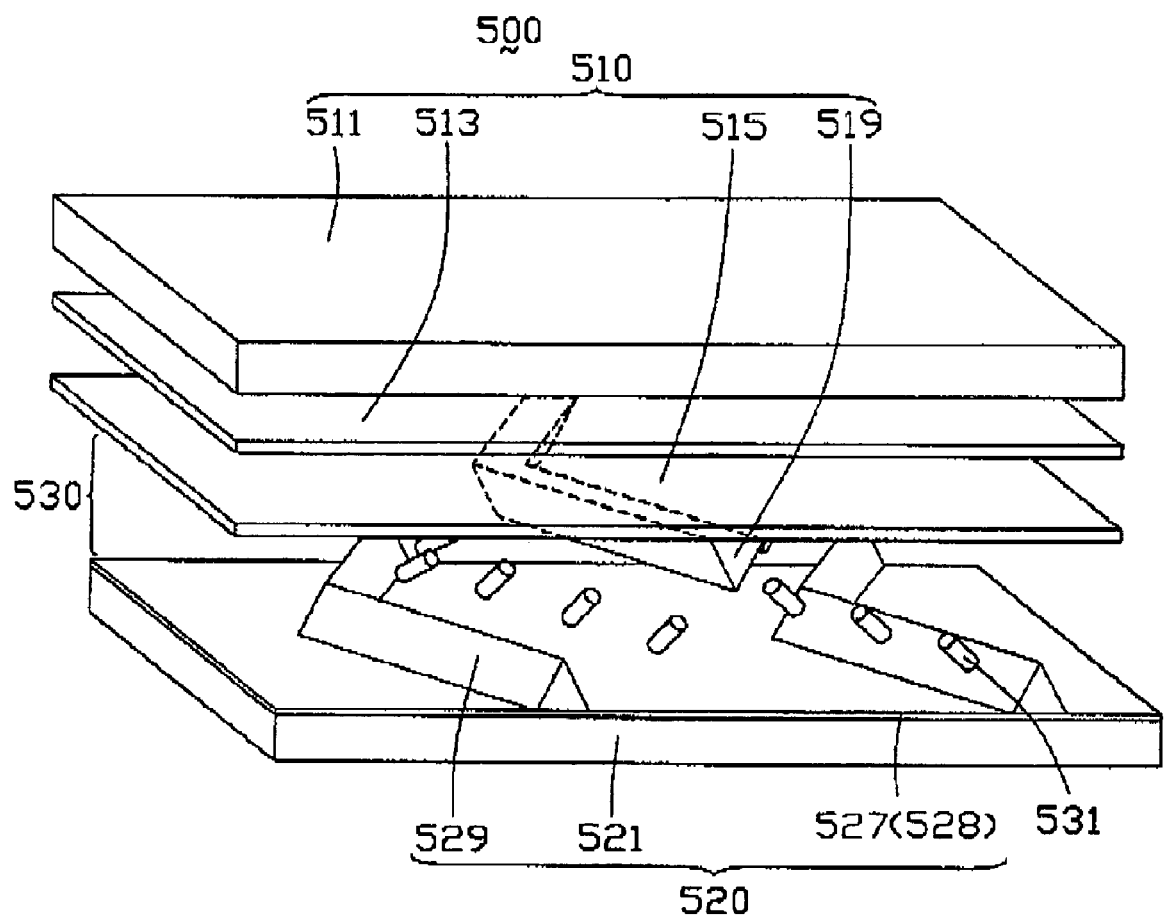
FIG. 11 is an exploded, isometric view of a conventional LCD device, the LCD device including a plurality of first protrusions, a plurality of second protrusions, and a plurality of pixel units.
Figure 12:
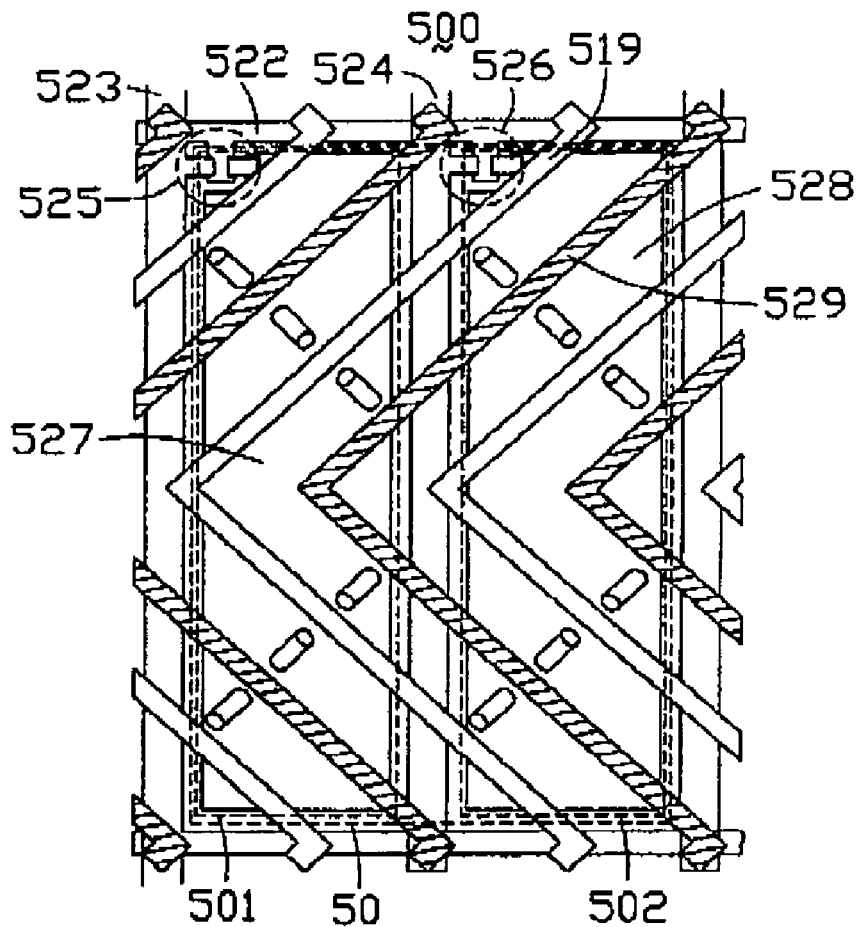
FIG. 12 is a top plan view of one pixel unit of the LCD device of FIG. 11, the pixel unit including a plurality of liquid crystal molecules.
Figure 13:
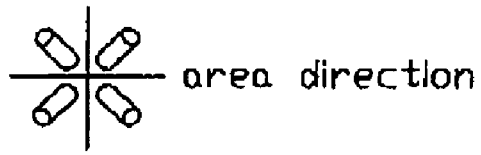
FIG. 13 is a top-down view of orientations of four of the liquid crystal molecules of FIG. 12, according to the corresponding first protrusions and second protrusions at the pixel unit.
Figure 14:
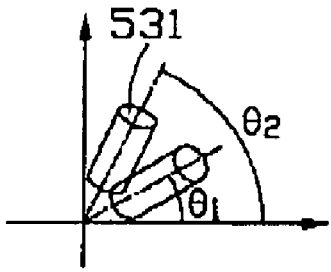
FIG. 14 is a side view of orientations of two of the liquid crystal molecules of FIG. 12, the liquid crystal molecules having different tilt angles.

Referring to FIG. 10, an LCD device 400 according to a fourth embodiment of the present invention is similar to the LCD device 300. However, each resistor 424 of the LCD device 400 is square-wave-shaped (i.e., concertinaed). The resistor 424 and a corresponding second TFT 426 cooperatively form a resistor assembly. The LCD device 400 can achieve advantages similar to those of the LCD device 300.

Further or alternative embodiments may include the following. In a first example, the source electrodes of the second TFTs 126, 226 are connected to the drain electrodes of the corresponding first TFTs 125, 225. In a second example, each of the LCD devices 100, 200 further includes patterned metal resistors, each of which connects the corresponding first pixel electrode 127, 227 and the source electrode of the corresponding second TFT 126, 226. The metal resistors can for example be long and thin, or square-wave-shaped. Each metal resistor and the corresponding second TFT 126, 226 cooperatively form a resistor assembly. In a third example, the resistor assemblies can be formed by other suitable elements or means that achieve a voltage drop between each first pixel electrode and the corresponding second pixel electrode. In a fourth example, the channel width/length ratios of the first TFTs and the second TFTs can be configured according to a desired display performance of the LCD device. In a fifth example, protrusions of at least one of a first substrate assembly and a second substrate assembly can be replaced by a plurality of slits defined by a common electrode or defined by a plurality of pixel electrodes.

It is believed that the present embodiments and their advantages will be understood from the foregoing description, and it will be apparent that various changes may be made thereto without departing from the spirit or scope of the invention or sacrificing all of its material advantages, the examples hereinbefore described merely being preferred or exemplary embodiments of the invention.

What is claimed is:

1. A liquid crystal display comprising:
   a plurality of gate lines parallel to each other; and
   a plurality of data lines parallel to each other and intersecting with the gate lines, every two adjacent gate lines and every two adjacent data lines defining a pixel unit, each pixel unit comprising:
      a first thin film transistor,
      a second thin film transistor,
      a first pixel electrode, and
      a second pixel electrode,
      gate electrodes of the first and second thin film transistors being connected to a same one of the gate lines, a source electrode of the first thin film transistor being connected to a corresponding one of the data lines, a drain electrode of the first thin film transistor being connected to the first pixel electrode, a source electrode of the second thin film transistor being connected to the first pixel electrode, and a drain electrode of the second thin film transistor being connected to the second pixel electrode, a channel width/length ratio of the second thin film transistor being such that a voltage of the drain electrode of the second thin film transistor is less than a voltage of the corresponding source electrode when the second thin film transistor is switched on.

2. The liquid crystal display of claim 1, wherein the channel width/length ratio of the second thin film transistor is 5/10.

3. The liquid crystal display of claim 1, wherein a channel width/length ratio of the first thin film transistor is such that a voltage of the drain electrode of the first thin film transistor is equal to a voltage of the corresponding source electrode when the first thin film transistor is switched on.

4. The liquid crystal display of claim 3, wherein the channel width/length ratio of the first thin film transistor is 15/5.

5. The liquid crystal display of claim 1, wherein a channel width/length ratio of the first thin film transistor is such that a voltage of the drain electrode of the first thin film transistor is less than a voltage of the corresponding source electrode when the first thin film transistor is switched on.

6. The liquid crystal display of claim 5, wherein the channel width/length ratio of the first thin film transistor is 5/10.

7. The liquid crystal display of claim 1, wherein a part of the first pixel electrode where the first pixel electrode joins the source electrode of the second thin film transistor forms a resistor.

8. The liquid crystal display of claim 7, wherein said part of the first pixel electrode is elongate.

9. The liquid crystal display of claim 7, wherein said part of the first pixel electrode is square-wave-shaped.

10. A liquid crystal display comprising:
a plurality of gate lines parallel to each other, and
a plurality of data lines parallel to each other and intersecting with the gate lines, every two adjacent gate lines and every two adjacent data lines defining a pixel unit, each pixel unit comprising:
a first pixel electrode,
a second pixel electrode,
a first thin film transistor, a gate electrode of the first thin film transistor being connected to a corresponding one of the gate lines, a source electrode of the first thin film transistor being connected to a corresponding one of the data lines, a drain electrode of the first thin film transistor being connected to the first pixel electrode, and
a resistor assembly, the resistor assembly connecting the first pixel electrode and the second pixel electrode and configured to render a voltage of the first pixel electrode different from a voltage of the second pixel electrode when a same data voltage is applied to the pixel unit.

11. The liquid crystal display of claim 10, wherein the resistor assembly comprises a second thin film transistor, which comprises a gate electrode connected to the same gate line that the first thin film transistor is connected to, a source electrode connected to the first pixel electrode, and a drain electrode connected to the second pixel electrode.

12. The liquid crystal display of claim 11, wherein a channel width/length ratio of the second thin film transistor is such that a voltage of the drain electrode of the second thin film transistor is less than a voltage of the corresponding source electrode when the second thin film transistor is switched on.

13. The liquid crystal display of claim 12, wherein the channel width/length ratio of the second thin film transistor is 5/10.

14. The liquid crystal display of claim 10, wherein the resistor assembly comprises a second thin film transistor, which comprises a gate electrode connected to the same gate line that the first thin film transistor is connected to, a source electrode connected to the drain electrode of the first thin film transistor, and a drain electrode connected to the second pixel electrode.

15. The liquid crystal display of claim 14, wherein a channel width/length ratio of the second thin film transistor is such that a voltage of the drain electrode of the second thin film transistor is less than a voltage of the corresponding source electrode when the second thin film transistor is switched on.

16. The liquid crystal display of claim 15, wherein the channel width/length ratio of the second thin film transistor is 5/10.

17. The liquid crystal display of claim 11, wherein the resistor assembly further comprises a metal resistor interconnecting the first pixel electrode and the source electrode of the second thin film transistor.

18. The liquid crystal display of claim 17, wherein the metal resistor is one of elongate and square-wave-shaped.

19. The liquid crystal display of claim 11, wherein a part of the first pixel electrode where the first pixel electrode joins the source electrode of the second thin film transistor is one of elongate or and square-wave-shaped.

20. The liquid crystal display of claim 10, wherein the resistor assembly comprises a metal resistor interconnecting the first pixel electrode and the second pixel electrode, the metal resistor being one of elongate and square-wave-shaped.

* * * * *